US006885250B1

United States Patent
Le et al.

(10) Patent No.: US 6,885,250 B1
(45) Date of Patent: Apr. 26, 2005

(54) CASCODE AMPLIFIER CIRCUIT FOR GENERATING AND MAINTAINING A FAST, STABLE AND ACCURATE BIT LINE VOLTAGE

(75) Inventors: Binh Q. Le, San Jose, CA (US); Lee Cleveland, Santa Clara, CA (US); Pauling Chen, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 38 days.

(21) Appl. No.: 10/844,116

(22) Filed: May 12, 2004

Related U.S. Application Data

(62) Division of application No. 10/302,672, filed on Nov. 22, 2002, now Pat. No. 6,768,677.

(51) Int. Cl.$^7$ .............................. H03F 3/04; H03F 3/45; G11C 16/06
(52) U.S. Cl. ...................... 330/311; 330/260; 365/185.2
(58) Field of Search .................................. 330/311, 260, 330/259; 365/185.2, 185.18, 185.21

(56) References Cited

U.S. PATENT DOCUMENTS

| 5,537,349 A | * | 7/1996 | Devin | 365/185.33 |
| 6,043,638 A | * | 3/2000 | Tobita | 323/313 |
| 6,738,285 B1 | * | 5/2004 | Tanizaki et al. | 365/158 |

* cited by examiner

Primary Examiner—Patrica Nguyen
(74) Attorney, Agent, or Firm—Farjami & Farjami LLP

(57) ABSTRACT

A cascode amplifier circuit which generates a fast, stable and accurate bit line voltage is disclosed. According to one exemplary embodiment, the cascode amplifier circuit comprises a transistor having a source connected to a bit line voltage and a drain connected to an output voltage. The cascode amplifier circuit also comprises a differential circuit having an inverting input connected to the bit line voltage, a non-inverting input connected to a reference voltage, and an output connected to a gate of the first transistor. The operation of the transistor and the differential circuit generate a fast, stable the accurate bit line voltage.

8 Claims, 2 Drawing Sheets

CASCODE AMPLIFIER CIRCUIT FOR GENERATING AND MAINTAINING A FAST, STABLE AND ACCURATE BIT LINE VOLTAGE

This is a divisional of application Ser. No. 10/302,672 filed Nov. 22, 2002, now U.S. Pat. No. 6,768,677.

TECHNICAL FIELD

The present invention relates generally to the field of semiconductor devices. More particularly, the present invention relates to generation of bit line voltages in a memory device.

BACKGROUND ART

Cascode amplifiers are known in the art for converting current to voltage. Current to voltage conversion is particularly useful when a comparison between a first current and a second current is required. The reason is that voltage comparators, such as operational amplifiers, for example, are readily available for comparing two voltage values. Accordingly, the conventional approach in comparing two current values involves first converting the current values to voltage values, and then comparing the voltage values using an operational amplifier.

In practice, the comparison of current values is useful in a wide variety of applications. For example, often the state of a device or component is indicated by the current associated with the device or component. In the case of a memory device, for example, the state of a memory cell within the memory device is typically indicated by the current drawn by the memory cell. For example, a memory cell may be defined as a "programmed" cell if the memory cell current is below a reference current value. Conversely, a memory cell may be defined as an "erased" cell if the memory cell current is above the reference current value. In this example, a comparison between the detected memory cell current and the reference current is needed to determine the state of the memory cell. As pointed out above, in practice, the memory cell current and the reference current are first converted to corresponding voltage values, and then the converted voltage values are compared using an operational amplifier.

Known cascode amplifiers suffer from several problems. First, while it is desirable to stabilize the voltage at the node connecting the cascode amplifier to the memory cell (i.e., the bit line voltage), it is often difficult to do so. The reason is that due to variations, such as variations in supply voltage, process and temperature, the threshold voltage (VT) of the transistors implemented in the cascode amplifier may have a wide varying range. Since the transistors implemented in the cascode amplifier are typically of different types (e.g., have different threshold voltage ranges), the transistors do not closely track each other with respect to these variations, thereby resulting in a bit line voltage which varies greatly and depends largely on such variations. An unstable bit line voltage may lead to an unreliable output voltage from the cascode amplifier. Accordingly, there exists a strong need in the art to overcome deficiencies of known cascode amplifier circuits, such as those described above, and to provide fast, stable and accurate bit line voltages.

SUMMARY

The present invention addresses and resolves the need in the art for a cascode amplifier circuit which generates a fast, stable and accurate bit line voltage. According to one exemplary embodiment, a cascode amplifier circuit comprises a first transistor having a source connected to a bit line voltage and a drain connected to an output voltage. The first transistor may, for example, be an enhancement mode FET, and, by way of example, the first transistor can be connected to a supply voltage through an enable transistor and a resistor.

The exemplary embodiment also comprises a differential circuit having an inverting input connected to the bit line voltage, a non-inverting input connected to a reference voltage, and an output connected to a gate of the first transistor. The differential circuit operates as a negative feedback differential amplifier. In one embodiment, the inverting input of the differential circuit comprises a second transistor, and the non-inverting input of the differential circuit comprises a third transistor, where, by way of illustration, a gate of the second transistor is connected to the bit line voltage, a drain of the second transistor is connected to the gate of the first transistor, and a gate of the third transistor is connected to the reference voltage. In this particular embodiment, the drain of the second transistor can also be connected to a supply voltage through one resistor, and a drain of the third transistor is connected to the supply voltage through another resistor. In one embodiment, the bit line voltage is connected to a memory cell through a selection circuit, where, for example, the memory cell has a source coupled to ground. Other features and advantages of the present invention will become more readily apparent to those of ordinary skill in the art after reviewing the following detailed description and accompanying drawings.

DETAILED DESCRIPTION OF THE INVENTION

The present invention is directed to a cascode amplifier circuit for generating a fast, stable and accurate bit line voltage. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
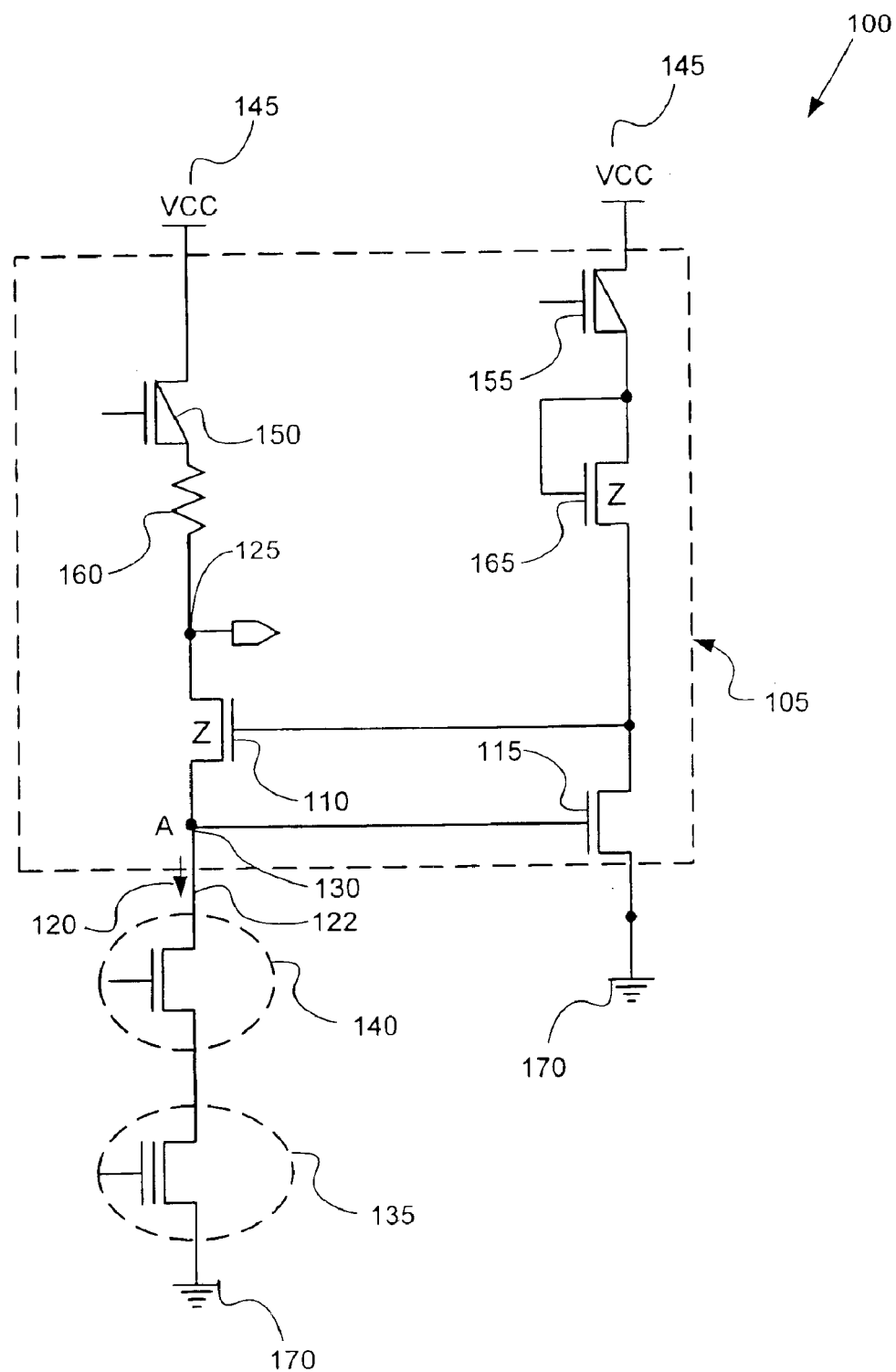
FIG. 1 depicts a circuit schematic of a known cascode amplifier circuit.

To illustrate the features and advantages of the present invention, a brief description of a known cascode amplifier circuit 105 for converting a bit line current to a voltage is provided with reference to FIG. 1. As shown, cascode amplifier circuit 105 may be part of a larger circuit arrangement 100 which itself may be, for example, part of a memory device.

Cascode amplifier circuit 105 generally comprises transistor 110 and transistor 115, where the gate terminal of transistor 110 is connected to the drain terminal of transistor 115 and the gate terminal of transistor 115 is connected to the source terminal of transistor 110 at node 130. The source terminal of transistor 115 is connected to ground 170. As shown in the FIG. 1, cascode amplifier circuit 105 further comprises enable transistors 150, 155, resistor 160, and transistor 165. Enable transistor 150 is connected to transistor 110 through resistor 160, and enable transistor 155 is connected to transistor 115 through transistor 165 operating as a resistive load. Enable transistors 150 and 155 are activated to turn on cascode amplifier circuit 105.

Cascode amplifier circuit 105 is further connected at node 130 to memory cell 135 through a selection circuit, generally shown as a simplified y-decoder 140, for sensing memory cell current 120 of memory cell 135. In operation, y-decoder 140 and memory cell 135 draw memory cell current 120 associated with memory cell 135 along line 122 (for the purpose of the present application, line 122 can be thought of as a "bit line" and, as such, referred to as "bit line 122" for simplicity). Responsive to memory cell current 120, cascode amplifier circuit 105 generates an output voltage at node 125. The output voltage at node 125 may, for example, be provided to an operational amplifier (not shown) for comparison with a reference voltage. A similar cascode amplifier circuit arrangement may be utilized to convert a reference current (associated with a reference cell) to a reference voltage for comparison with the output voltage at node 125. In this manner, the state of the memory cell may be determined by comparing the output voltage at node 125 with the reference voltage utilizing an operational amplifier.

However, there are several drawbacks associated with cascode amplifier circuit 105. First, while it is desirable to stabilize the voltage at node 130, i.e. the bit line voltage, variations in supply voltage, temperature and process may result in an unstable bit line voltage at node 130, creating a potential for errors, for example, errors during a read operation. As noted above, due to variations, such as variations in process and temperature, the threshold voltage (VT) of transistors 110, 115, and 165 may have a varying range. Since transistors 110, 115 and 165 of cascode amplifier circuit 105 are of different types, e.g. have different threshold voltage ranges, transistors 110, 115 and 165 do not closely track with respect to these variations. As a result, bit line voltage at node 130 varies greatly and depends largely on such variations. For example, in certain cases, the bit line voltage at node 130 may vary from about 450 to 800 milliVolts (mV), which is unacceptable, particularly when a relatively constant voltage of between 650 and 700 mV is sought at node 130. Moreover, an unstable bit line voltage at node 130 may produce variations in memory cell current 120. Since the output voltage 125 is based on memory cell current 120, an unreliable memory cell current 120 due to an unstable bit line voltage at node 130 may lead to an unreliable output voltage at node 125 produced by cascode amplifier circuit 105.

Figure 2:
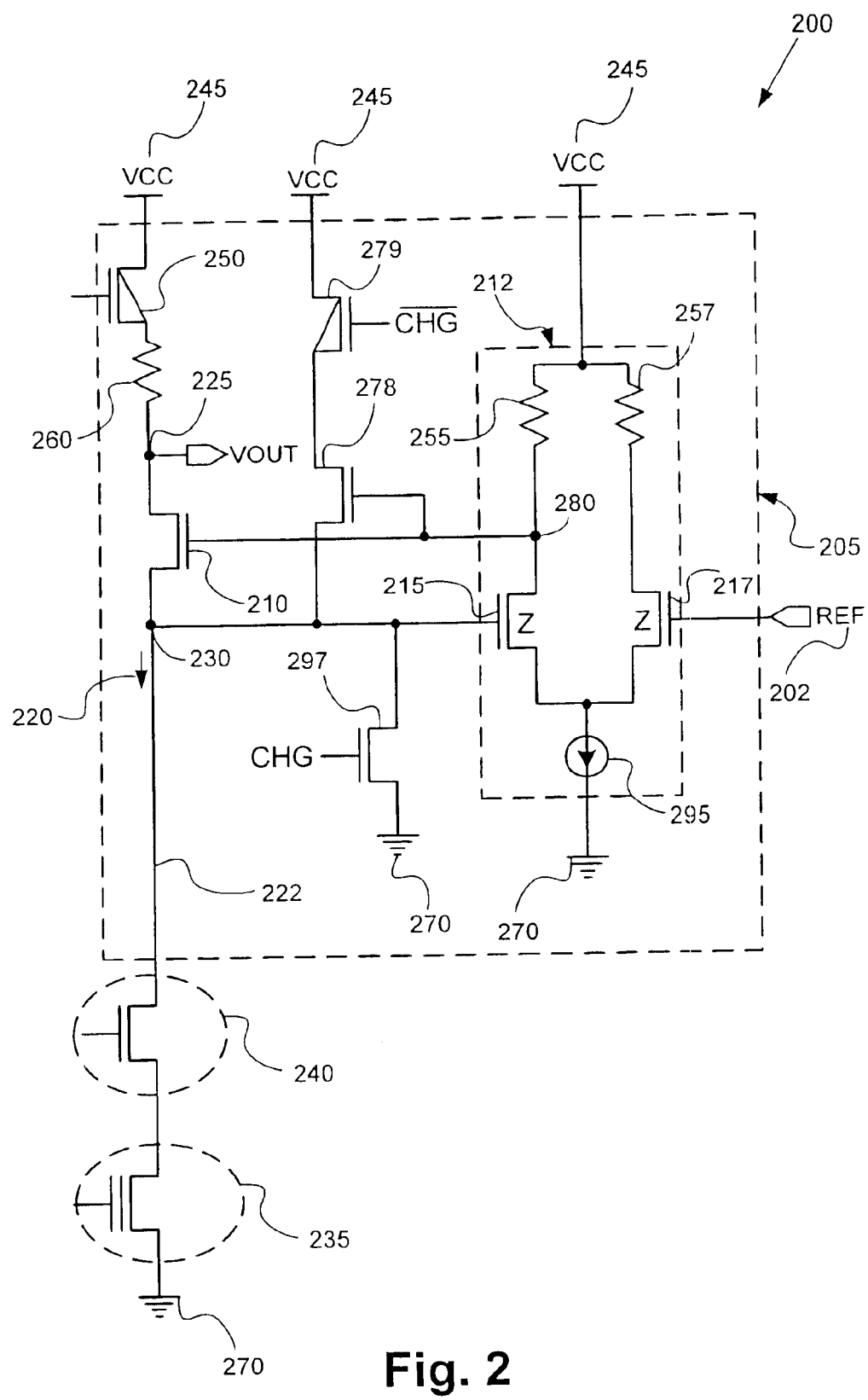
FIG. 2 depicts a circuit schematic of one embodiment of a cascode amplifier circuit in accordance with the present invention.

Referring now to FIG. 2, there is shown a circuit schematic of a cascode amplifier circuit 205 in accordance with one embodiment of the present invention which addresses and resolves the need in the art for generating a fast, stable and accurate bit line voltage. Cascode amplifier circuit 205 may be a portion of a larger circuit arrangement 200, which itself may be, for example, part of a memory device. Accordingly, cascode amplifier circuit 205 may be electrically connected to various other circuits and/or electrical components. In the illustrative embodiment depicted in FIG. 2 and described below, cascode amplifier circuit 205 is utilized to convert memory cell current to voltage, although the present invention is also suitable for converting current to voltage in a wide variety of applications in other embodiments.

Cascode amplifier circuit 205 is configured to receive input reference voltage signal (REF) 202 and supply voltage (VCC) 245 and generate output voltage (VOUT) at node 225 by sensing memory cell current 220. Cascode amplifier circuit 205 is further configured to generate a fast, stable and accurate bit line voltage at node 230. As shown in FIG. 2, cascode amplifier circuit 205 is connected at node 230 to memory cell 235 through a selection circuit, generally shown as a simplified y-decoder 240, for sensing memory cell current 220. The source terminal of memory cell 235 is connected to ground 270.

In the present embodiment, VCC 245 provides a supply voltage in a range of about 1.6 to 2.0 Volts (V), and REF 202 provides a reference voltage in the range of about 0.65 to 0.7 V (or another voltage such as 0.8 V). When activated, y-decoder 240 and memory cell 235 draw memory cell current 220 associated with memory cell 235 along line 222 (for the purpose of the present invention, line 222 can be thought of as a "bit line" and, as such, referred to as "bit line 222" for simplicity). As described above, memory cell current 220 may indicate the state, i.e. "programmed" or "erased," of memory cell 235, for example.

Referring now to the details of cascode amplifier circuit 205, cascode amplifier circuit 205 comprises transistor 210 and differential circuit 212. In the particular embodiment depicted in FIG. 2, transistor 210 is an n-channel FET (NFET), such as an enhancement mode NFET, for example. According to one embodiment, transistor 210 has a threshold voltage (VT) in the range of about 0.3 to 0.6 V. The source terminal of transistor 210 is connected at node 230 to bit line 222 of y-decoder 240 and memory cell 235. Node 230 is further connected to one input of differential circuit 212. In the particular embodiment depicted in FIG. 2, node 230 is connected to the inverting input of differential circuit 212 as described in greater detail below. The gate terminal of transistor 210 is connected at node 280 to the output of differential circuit 212. The drain terminal of transistor 210 is connected to node 225 where VOUT is generated by cascode amplifier circuit 205. Supply voltage VCC 245 can be coupled to the drain terminal of transistor 210 at node 225 through enable transistor 250 and resistor 260. In the particular embodiment depicted in FIG. 2, enable transistor 250 is a p-channel FET (PFET), which is activated to turn on cascode amplifier circuit 205. In one embodiment, resistor 260 is about 15 to 30 kiloOhms (kΩ).

Cascode amplifier circuit 205 may further comprise charging transistors 279 and 278. In the particular embodiment depicted in FIG. 2, transistor 278 is an NFET, such as an enhancement mode NFET, and transistor 279 is a PFET. The source terminal of transistor 278 is connected to node 230, while the gate terminal of transistor 278 is connected to node 280 and the drain terminal of transistor 278 is coupled to the drain terminal of transistor 279. The source terminal of transistor 279 is connected to supply voltage VCC 245 and the gate terminal of transistor 279 is supplied a charging signal (indicated as $\overline{CHG}$ in FIG. 2). Charging signal $\overline{CHG}$ supplies a temporary signal during initial activation of cascode amplifier circuit 205. When transistors 279 and 278 are activated, the voltage 230 is quickly pulled up to the desired voltage, i.e., in the range of about 0.65 to 0.7 V (or another voltage such as 0.8 V), in the present example, after which transistors 279 and 278 are switched off. Cascode amplifier circuit 205 may further comprise NFET transistor 297 having a drain terminal connected to node 230 and a source terminal connected to ground 270. A temporary charging signal (indicated as CHG in FIG. 2) is supplied to the gate terminal of transistor 297 during initial activation of cascode amplifier circuit 205. When activated, transistor 297 acts to clamp the voltage at node 230 close to the desired voltage, i.e., in the range of about 0.65 to 0.7 V (or another voltage such as 0.8 V) and protect against overshoot of the voltage at node 230 when initially pulled up by charging transistors 279 and 278. After the initial activation of cascode amplifier circuit 205, transistors 279, 278 and 297 are switched off and will not affect the operation of cascode amplifier circuit 205.

According to the particular embodiment depicted in FIG. 2, differential circuit 212 operates as a negative feedback differential amplifier and comprises transistors 215, 217 and resistors 255, 257. It is noted that resistors 255 and 257 are utilized as simple models to represent various types of resistive loads such as, for example, transistors configured to operate as resistors, as well as ordinary resistors comprising low conductivity materials. As shown in FIG. 2, transistors 215, 217 are n-channel FETs (NFETs), such as depletion mode NFETs, for example. According to one embodiment, each transistor 215 or 217 has a $V_T$ in the range of about –0.4 to 0.1 V and operates in the saturation region. The gate terminal of transistor 215 is connected to node 230 and forms the inverting input of differential circuit 212. The gate terminal of transistor 217 forms the non-inverting input of differential circuit 212 and is supplied REF 202. The source terminals of transistors 215 and 217 are connected to ground 270 through current source 295. The drain terminal of transistor 215 is connected to node 280 to form the output of differential circuit 212. As described previously, the output of differential circuit 212 at node 280 is connected to the gate terminal of transistor 210. Node 280 is further connected to VCC 245 through resistor 255. The drain terminal of transistor 217 is connected to VCC 245 through resistor 257. Resistors 255 and 257 in differential circuit 212 provide predetermined resistive loads and, as stated above, may be replaced by other loads in other embodiments (e.g., current mirror loading circuits). Furthermore, differential circuit 212 might be a two-stage, three-stage, or multi-stage differential circuit in other embodiments instead of the single-stage differential circuit illustrated in the particular embodiment depicted in FIG. 2.

Turning now to the operation of cascode amplifier circuit 205, cascode amplifier circuit 205 is activated by enable transistor 250. For example, when a read operation involving memory cell 235 is to be performed, transistor 250 is activated and cascode amplifier circuit 205 is thus activated. Due to selection of memory cell 235, current 220 is drawn by memory cell 235 through Y-decoder 240. Responsive to memory cell current 220, VOUT is developed through resistor 260 at node 225. In general, a higher memory cell current 220 through bit line 222 corresponds with a lower VOUT generated at node 225. Conversely a lower memory cell current 220 through bit line 222 corresponds with a higher VOUT generated at node 225. The VOUT generated at node 225 may then be supplied to an operational amplifier for comparison with a reference voltage corresponding to a reference cell, as described above.

The bit line voltage at node 230 is generated in a fast, stable and accurate manner by differential circuit 212 in conjunction with transistor 210. In the particular embodiment of FIG. 2, the desired bit line voltage at node 230 is in the range of about 0.65 to 0.7 V (or another voltage such as 0.8 V). To achieve a fast, stable, and accurate bit line voltage at node 230 corresponding to the above range, differential circuit 212 is configured to receive REF 202 at its non-inverting input (corresponding with the gate terminal of transistor 217). As described above, REF 202 provides a relatively stable voltage level, which in the particular embodiment depicted in FIG. 2 is in the range of about 0.65 to 0.7 V (or another voltage such as 0.8 V). Differential circuit 212 is further configured to receive the bit line voltage at node 230 at its inverting input (corresponding to the gate terminal of transistor 215 which is driven by bit line voltage at node 230). Differential circuit 212 then provides a voltage output at node 280. Differential circuit 212 operates so that the voltage output at node 280 increases as the inverting input voltage (corresponding to bit line voltage at node 230) decreases below the non-inverting input voltage (corresponding to REF 202). Conversely, the voltage output at node 280 decreases as the inverting input voltage (corresponding to bit line voltage at node 230) increases above the non-inverting input voltage (corresponding to REF 202).

The voltage output at node 280 controls the gate terminal of transistor 210 and operates as negative feedback in this arrangement to stabilize the bit line voltage level at node 230 despite variations. For example, when the $V_T$ of transistor 210 is low (e.g., close to 0.3 V), transistor 210 conducts more current which acts to increase the bit line voltage at node 230. As the bit line voltage at node 230 increases above REF 202, differential circuit 212 decreases the voltage output at node 280. As a result, the voltage supplied to transistor 210 via node 280 is decreased, and transistor 210 conducts less current, thereby reducing the bit line voltage at node 230 and offsetting the increased bit line voltage at node 230 due to the low $V_T$ of transistor 210. On the other hand, when the $V_T$ of transistor 210 is high (e.g., close to 0.6 V), transistor 210 conducts less current which acts to decrease the bit line voltage at node 230. As the bit line voltage at node 230 decreases below REF 202, differential circuit 212 increases the voltage output at node 280. As a result, the voltage supplied to transistor 210 via node 280 is increased, and transistor 210 conducts more current, thereby increasing the bit line voltage at node 230 and offsetting the decreased bit line voltage at node 230 due to the high $V_T$ of transistor 210. In effect, the bit line voltage at node 230 is stabilized and held close to the voltage of REF 202 in the particular embodiment of FIG. 2.

In sum, the bit line voltage at node 230 is generated and maintained in a fast, stable and accurate manner by cascode amplifier circuit 205 and is generally immune to variations in supply voltage, process and temperature. Consequently, the VOUT generated at node 225 corresponds more accurately to memory cell current 220 associated with memory cell 235. The VOUT generated at node 225 by cascode amplifier circuit 205 can then be used for a reliable comparison with a reference voltage corresponding to a reference cell.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. For example, the types of transistors, resistive loads, and the particular voltages or voltage ranges referred to in the present application can be modified without departing from the scope of the present invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, a cascode amplifier circuit for producing a fast, stable, and accurate bit line voltage has been described.

What is claimed is:

1. A cascode amplifier circuit comprising:

means for receiving a reference voltage;

means for receiving a bit line voltage;

means for generating a negative feedback voltage responsive to said reference voltage and said bit line voltage; and means for utilizing said negative feedback voltage to stabilize said bit line voltage.

2. The cascode amplifier circuit of claim 1, wherein said means for utilizing said negative feedback voltage comprises a first transistor having a source connected to said bit line voltage and a drain connected to an output voltage.

3. The cascode amplifier circuit of claim 2, wherein said first transistor is an enhancement mode FET.

4. The cascode amplifier circuit of claim 2, wherein said first transistor is connected to a supply voltage through a second transistor and a resistor.

5. The cascode amplifier circuit of claim 2, wherein said bit line voltage is connected to a memory cell through a selection circuit.

6. The cascode amplifier circuit of claim 2, wherein said means for receiving a reference voltage comprises a non-inverting input of said means for generating said negative feedback voltage and said means for receiving said bit line voltage comprises an inverting input of said means for generating said negative feedback voltage.

7. The cascode amplifier circuit of claim 6, wherein said inverting input comprises a second transistor and said non-inverting input comprises a third transistor, and wherein a gate of said second transistor is connected to said bit line voltage, a drain of said second transistor is connected to said gate of said first transistor, and a gate of said third transistor is connected to said reference voltage.

8. The cascode amplifier circuit of claim 7, wherein said drain of said second transistor connected to a supply voltage through a first resistor, and a drain of said third transistor is connected to said supply voltage through a second resistor.

* * * * *